United States Patent
Pramanick et al.

(10) Patent No.: US 6,180,469 B1
(45) Date of Patent: Jan. 30, 2001

(54) LOW RESISTANCE SALICIDE TECHNOLOGY WITH REDUCED SILICON CONSUMPTION

(75) Inventors: Shekhar Pramanick, Fremont; Qi Xiang, Santa Clara; Ming-Ren Lin, Cupertino, all of CA (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 09/187,522

(22) Filed: Nov. 6, 1998

(51) Int. Cl.[7] .................................................. H01L 21/336
(52) U.S. Cl. ...................... 438/299; 438/300; 438/301; 438/592; 438/630; 438/649; 438/674; 438/682
(58) Field of Search .................................... 438/300, 301, 438/630, 649, 674, 682, 592

(56) References Cited

U.S. PATENT DOCUMENTS

| | | |
|---|---|---|
| 5,317,187 | * 5/1994 | Hindman et al. . |
| 5,529,958 | * 6/1996 | Yaoita . |
| 5,550,084 | * 8/1996 | Anjum et al. . |
| 5,589,417 | * 12/1996 | Jeng . |
| 5,721,175 | * 2/1998 | Kunishima et al. . |
| 5,733,816 | * 3/1998 | Iyer et al. . |
| 5,750,437 | * 5/1998 | Oda . |
| 5,902,129 | * 5/1999 | Yoshikawa et al. . |
| 5,937,315 | * 8/1999 | Xiang et al. . |
| 5,970,370 | * 12/1998 | Besser et al. . |
| 5,976,962 | * 11/1999 | Oda . |
| 5,981,372 | * 11/1999 | Goto et al. . |
| 5,994,191 | * 7/1998 | Xiang et al. . |
| 6,015,752 | * 6/1998 | Xiang et al. . |
| 6,030,863 | * 9/1998 | Chang et al. . |
| 6,033,978 | * 3/2000 | Fujii et al. . |
| 6,037,233 | * 3/2000 | Liu et al. . |

OTHER PUBLICATIONS

Wei et al, "The use of selective electroless metal deposition for micron size contact fill," IEDM IEEE, p. 446, 1988.*
Wielunski et al, "Alteration of Ni Silicide Formation by N Implantation," Appl. Phys. Lett. 38 (2) pp. 106–108, Jan. 15, 1981.*
Lee et al, "A selective CVD tungsten local interconnect technology," IEEE IEDM pp. 450–454, 1988.*
Wielunski et al, "Improvement of thermally formed nickel silicide by ion irradation," Journ. of Vacuum Sci. Tech. pp. 182–185, vol. 20, Issue 2, Feb. 1982.*

* cited by examiner

Primary Examiner—John F. Niebling
Assistant Examiner—Jonathan Hack

(57) ABSTRACT

Low resistivity contacts are formed on source/drain regions and gate electrodes at a suitable thickness to reduce parasitic series resistances, thereby significantly reducing consumption of underlying silicon, while significantly reducing junction leakage. Embodiments include selectively depositing a metal layer, such as nickel, on the source/drain regions and on the gate electrode and ion implanting to form a barrier layer within the nickel layers which does not react with silicon or nickel silicide during subsequent solicitation. The barrier layer confines salicidation to the relatively thin underlayer layer of nickel, thereby minimizing consumption of underlying silicon while the unsilicidized overlying nickel on the barrier layer ensures low sheet resistivity.

12 Claims, 3 Drawing Sheets

LOW RESISTANCE SALICIDE TECHNOLOGY WITH REDUCED SILICON CONSUMPTION

RELATED APPLICATIONS

This application contains subject matter related to subject matter disclosed in copending U.S. patent applications Ser. No. 09/106,769 filed on Jun. 30, 1998, now U.S. Pat. No. 6,015,752 issued Jan. 18, 2000; Ser. No. 09/323,818 filed on Jan. 2, 1999 now U.S. Pat. No. 6,083,817; Ser. No. 09/187,522 filed on Nov. 6, 1998; Ser. No. 08/992,841 filed on Dec. 18, 1997 now U.S. Pat. No. 6,118,76; and Ser. No. 09/186,657 filed on Nov. 6, 1998.

TECHNICAL FIELD

The present invention relates to semiconductor manufacturing, particularly to self-aligned silicide (silicide) technology. The present invention is particularly applicable to manufacturing ultra large scale integrated circuit (U.S.S.) Systems having features in tile deep-sub micron range.

BACKGROUND ART

Deep-submicron scaling required for ULSI Systems dominates design considerations in the micro electronics industry. As the gate electrode length is scaled down, the source and drain junctions must be scaled down accordingly, to suppress the so-called short channel effects (SCE) which degrade performance of miniaturized devices. A major problem related to complementary metal oxide silicon (CMOS) scaling is the undesirable increase in parasitic resistance. As the source/drain junction depth ($X_j$) and polycrystalline silicon line width are scaled into the deep-submicron range, parasitic series resistances of the source/drain diffusion layers and polysilicon gate electrodes increase. A conventional approach to the increase in parasitic series resistances of the source/drain diffusion layers and the polysilicon gate electrodes involves salicide technology which comprises forming a layer of titanium silicide ($TiSi_2$) on the source/drain regions and gate electrode.

Conventional salicide technology employing $TiSi_2$ for reducing parasitic series resistance has proven problematic, particularly as design rules plunge into the deep-submicron range, e.g., about 0.18 microns and under. For example, in forming a thin $TiSi_2$ layer, silicide agglomeration occurs during silicide annealing to effect a phase change from the high resistivity C49 form to the low resistivity C54 form. Such agglomeration further increases the sheet resistance of the silicide film. Moreover, the formation of a thick silicide layer causes a high junction leakage current and low reliability, particularly when forming ultra shallow junctions, e.g., at an $X_j$ of less than about 800 Å. The formation of a thick silicide layer consumes silicon from the underlying semiconductor substrate such that the thick silicide layer approaches and even shorts the ultra-shallow junction, thereby generating a high junction leakage current.

Another problem attendant upon conventional $TiSi_2$ technology is the well-known increase in sheet resistance as the line width narrows. The parasitic series resistances of source/drain regions and gate electrodes are a major cause of device performance degradation and are emerging as one of the severest impediments to device scaling.

There are additional problems attendant upon conventional silicide technology employing titanium or other metals, such as cobalt, which problems are exacerbated as design rules extend into the deep-submicron range, e.g. about 0.18 microns and under. For example, conventional salicide technology for deep-submicron CMOS transistors comprises depositing a layer of metal at a predetermined thickness by physical vapor deposition (PVD), such as sputtering, over the entire wafer surface and then conducting a two step rapid thermal annealing with an intervening etching step to remove unreacted metal from the dielectric sidewall spacers on the gate electrode as well as the field isolation region. The need to remove unreacted metal from the dielectric sidewall spacers and field isolation region complicates processing and reduces manufacturing throughput as well as device reliability. In addition, as devices are scaled smaller and smaller, shorting between source/drain regions and the gate electrode becomes significant due to high temperature processing required to form low resistivity silicide layers.

There exist a need for simplified salicide technology which enables a reduction in parasitic series resistances. There exist a particular need for simplified salicide methodology in manufacturing semiconductor devices having a design rule in the deep-submicron range, e.g. a design rule less than about 0.18 microns, with increased reliability and reduced shorting between source/drain regions and the gate electrode.

DISCLOSURE OF THE INVENTION

An advantage of the present invention is a semiconductor device including a transistor comprising low resistivity contacts and exhibiting reduced parasitic series resistance and reduced leakage current.

A further advantage of the present invention is a method of manufacturing a semiconductor device having an elevated salicide structure formed with significantly reduced consumption of silicon from the underlying substrate or gate electrode.

Another advantage of the present invention is a method of manufacturing semiconductor device having a design rule less than about 0.18 microns with source/drain regions having an ultra shallow junction less than about 800 Å utilizing elevated salicide technology, thereby significantly reducing consumption of silicon from the substrate and gate electrode and, hence, avoidin, the generation of high leakage current while reducing parasitic series resistances.

Additional advantages and other features of the present invention will be set forth in part in the description which follows, and in part will become apparent to those having ordinary skill in the art upon examination of the following or may be learned by practice of the present invention. The advantages of the present invention may be realized and attained as particularly pointed out in the appended claims.

According to the present invention, the foregoing and other advantages are achieved in part by a method of manufacturing a semiconductor device, the method comprising: forming a structure comprising: a silicon-containing substrate; source/drain regions in the substrate with a channel region therebetween; a gate dielectric layer on the substrate over the channel region; a silicon-containing gate electrode, having an upper surface and side surfaces, on the gate dielectric layer; and a dielectric sidewall spacer on each side surface of the gate electrode, leaving a portion of each source/drain region exposed; selectively depositing a metal layer on the exposed portion of each source/drain region and on the upper surface of the gate electrode, with substantially no metal depositing on the dielectric sidewall spacers; forming a barrier layer within and dividing each metal layer into a lower metal portion below and an upper metal portion above the barrier layer; and heating to react the lower metal portion of each metal layer to form a metal silicide layer on the exposed portions of the source/drain regions and on the upper surface of the -ate electrode.

Another aspect of the present invention is a method of manufacturing a semiconductor device, the method comprising: forming a structure comprising a silicon-containing substrate; source/drain regions in the substrate with a channel region therebetween; a ,ate dielectric layer on the substrate over the channel region; a silicon-containing gate electrode, having an upper surface and side surfaces, on the gate dielectric layer; and a dielectric sidewall spacer on each side surface of the gate electrode, leaving a portion of each source/drain region exposed; selectively depositing a layer of nickel by electroless plating on the exposed portions of the source/drain region and on the upper surface of the gate dielectric layer; ion implanting nitrogen and annealing to form a nickel nitride barrier layer within and dividing each nickel layer into a lower nickel portion below and an upper nickel portion above the barrier layer; and heating to react the lower nickel portion of each metal layer to form a nickel silicide layer on the exposed portions of the source/drain regions and on the upper surface of the gate electrode.

A further aspect of the present invention is a semiconductor device comprising: a silicon substrate; source/drain regions in the substrate with a channel region therebetween; a gate dielectric layer on the substrate over the channel region; a silicon gate electrode, having a upper surface and side surfaces, on the gate dielectric layers; a dielectric sidewall spacer on each side surface of the gate electrode, leaving a portion of each source/drain region exposed; and a self-aligned conductive composite formed on the exposed portion of each source/drain region and on the upper surface of the gate electrode, each conductive composite comprising: a lower metal silicide layer; a barrier layer on the metal silicide layer; and a metal layer on the barrier layer.

Additional advantages of the present invention will become readily apparent to those skilled in the art from the following detailed description, wherein embodiments of the present invention are described simply by way of illustrating the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

DESCRIPTION THE INVENTION

Figure 1:
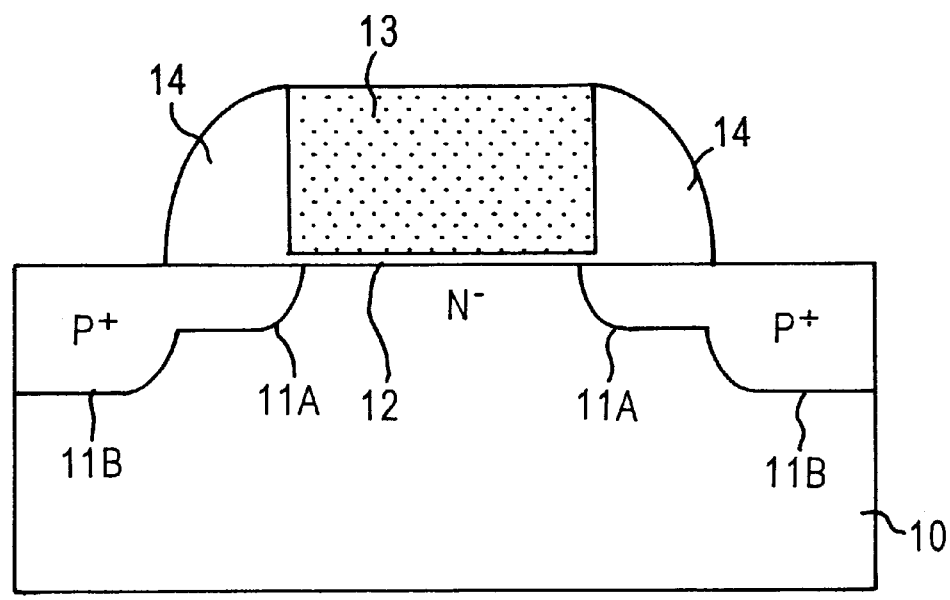
FIGS. 1–4 schematically illustrate sequential phases in accordance with an embodiment of the present invention.

The present invention addresses and solves problems attendant upon conventional salicide technology for parasitic series resistances. Conventional salicide methodology comprises forming a layer of $TiSi_2$ on the source/drain diffusion layers and on the silicon gate electrode, to prevent an increase in parasitic series resistance due to scaling down of the source/drain junction depth and silicon line width. However, the formation of a sufficiently thick $TiSi_2$ layer on the source/drain regions and on the gate electrode to reduce parasitic series resistances generates a leakage current, in that the $TiSi_2$ layer on the source/drain regions approaches and frequently overlaps the shallow junction causing an increase in junction leakage current. If a thin $TiSi_2$ layer is employed, a high sheet resistance would result. Moreover, $TiSi_2$ undergoes agglomeration upon annealing from the high resistivity C49 phase to the low resistivity C54 phase, thereby further increasing sheet resistance. $TiSi_2$ also increases in sheet resistance as the line width is narrowed.

The present invention addresses and solves such problems by providing an elevated salicide technology for source/drain regions and gate electrodes for lowering parasitic series resistances. In accordance with various embodiments of the present invention, a low resistivity composite layer is formed on the source/drain regions and gate electrode, which low resistivity composite layer contains a lower metal silicide layer, a barrier layer on the metal silicide layer and a metal layer on the barrier layer. Advantageously, the metal silicide layer of the composite is formed with significantly reduced consumption of silicon from the underlying source/drain regions and gate electrode, thereby significantly improving the junction leakage and reliability of ultra-shallow junctions. The present invention enjoys utility in manufacturing any of various types of semiconductor devices, particularly advanced deep-submicron CMOS devices, such as 0.1 microns devices with ultra-shallow junctions, e.g., less than about 800 Å. The present invention enables the formation of low resistivity contacts having a thickness sufficient to reduce parasitic series resistance. e,g,. above about 500 Å to about 2000 Å, while significantly improving the reliability of ultra-shallow junctions.

In accordance with embodiments of the present invention, a metal layer is selectively deposited on the source/drain regions and the gate electrode. Thus, the metal layer is self-aligned with the source/drain regions and gate electrode. After depositing the metal layer, a barrier layer is formed within and across the metal layer dividing the metal layer into a lower metal portion and an upper metal portion separated by the barrier layer. Embodiments of the present invention include forming the barrier layer by ion implantation. For example, a nickel layer is selectively deposited by electroless plating on the source/drain regions and gate electrode. Ion implantation is then conducted to implant an atomic species which reacts with nickel, as upon subsequent annealing, to form the barrier layer which prevents silicidation of the upper nickel portion during subsequent silicidation. Embodiments include ion implanting nitrogen to form a barrier layer comprising nickel nitride, ion implanting boron to form a barrier layer comprising nickel boride and ion implanting carbon to form a barrier layer comprising nickel carbide. It should be understood that the resulting barrier layer should be a good conductor and does not react with silicon or nickel silicide during the subsequent silicidation heating and/or thermal cycling during backend processing.

A particular advantageous feature of embodiments of the present invention comprises forming a composite layer with a relatively thin lower metal portion, thereby minimizing consumption of silicon from the underlying substrate and gate electrode during silicidation, as silicidation is confined to the lower portion by the barrier layer. The thin silicide layer ensures low contact resistance, while the remainder of the unsilicidated metal on the barrier layer ensures low sheet resistance for both shallow source/drain junctions and narrow polysilicon gates.

Embodiments of the present invention comprise depositing a metal layer, e.g. nickel, at a thickness greater than about 500 Å to about 2000 Å, e.g. substantially corresponding to that of the polycrystalline silicon gate electrode. Ion implantation is then conducted, as by implanting nitrogen into the nickel layer at a dosage of about $1 \times 10^{15}$ atoms $cm^{-2}$ to about 1×10$^{17}$ atoms cm$^{-2}$ and at an implantation energy of about 10 KeV to about 100 KeV. A rapid thermal annealing or thermal annealing is then conducted to form the barrier metal layer, as at a temperature of about 200° C. to about 700° C., thereby dividing the deposited nickel layer into a lower nickel silicide or nickel portion and upper nickel portion separated by the barrier layer. During such annealing, some or all of the lower nickel portion may react with the substrate to form nickel silicide. The lower nickel portion (or nickel silicide) is preferably considerably thinner than the upper nickel portion, thereby minimizing the degree of silicon consumption. For example: the lower nickel portion can have a thickness of about 5 Å to about 100 Å; the barrier layer can have a thickness of about 20 Å to about 300 Å; and the upper nickel portion can a thickness of about 500 Å to about 1500 Å. Further heating may be conducted to form a nickel monosilicide layer by reacting the lower nickel portion with the underlying silicon to form nickel silicide at a temperature of about 375° C. to about 750° C. Embodiments of the present invention comprise heating to simultaneously complete formation of the barrier layer and effect silicidation. In another embodiment, silicidation is effected by thermal cycling during backend processing. The resulting composite low resistivity contact typically has a thickness of about 10 Å to about 200 Å. The present invention, therefore, enables the formation of self-aligned contacts at a suitable thickness to minimize parasitic series resistance while maintaining the integrity of the ultra-shallow source/drain regions and narrow polycrystalline silicon gates for increased miniaturization.

In accordance with the present invention, the substrate typically comprises crystalline silicon, e.g., monocrystalline silicon. The substrate can either be a p-type substrate or an n-type substrate, with the source/drain regions having a conductivity type opposite to that of the substrate.

Sequential phases of a method in accordance with an embodiment of the present invention are schematically illustrated in FIGS. 1–4, wherein similar reference numerals denote similar features. Adverting to FIG. 1, a conventional transistor structure, formed in a conventional manner, comprises substrate 10 doped with an n-type impurity, and source/drain regions comprising a shallow extension region 11A and a heavily doped (HD) region 11B doped with a p-type impurity. The source/drain regions are formed in a conventional manner as, for example, by forming gate electrode layer 13 on semiconductor substrate 10 with gate dielectric layer 12, e.g., a gate oxide such as silicon dioxide, therebetween. Using the gate electrode as a mask, shallow extension regions 11A are formed. Dielectric sidewall spacers 14 are then formed on the side surfaces of gate electrode 13. Dielectric sidewall spacers can comprise any suitable dielectric material, such as silicon dioxide, silicon nitride or a composite of silicon dioxide and silicon nitride. Ion implantation is then conducted, using the gate electrode 13 and sidewall spacers 14 as a mask, to form HD regions 11B.

Figure 2:
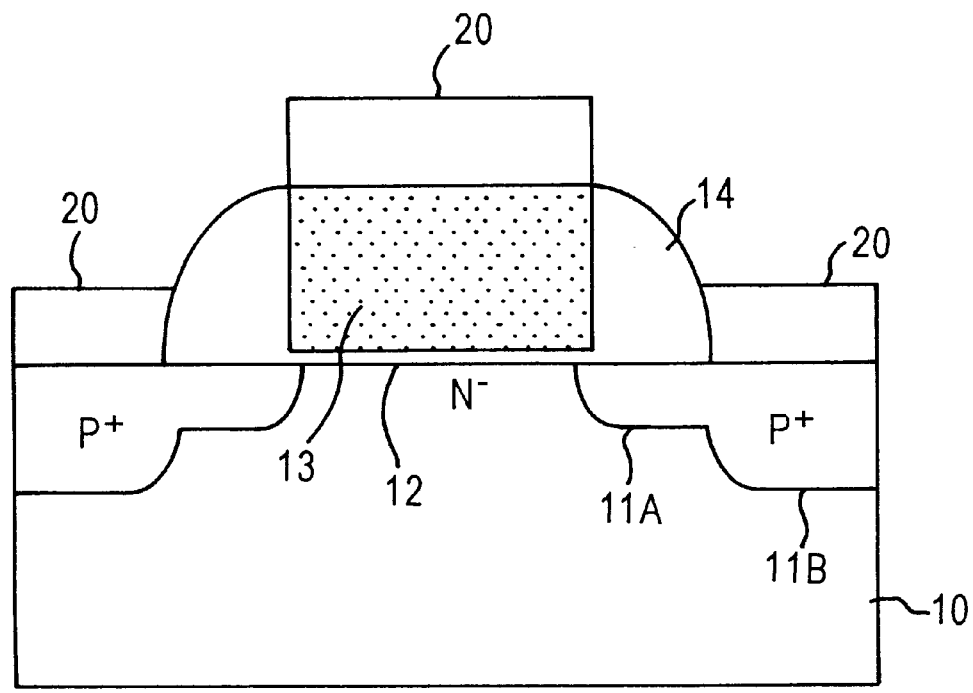

Adverting to FIG. 2, a metal layer 20, such as nickel, is selectively formed on the exposed portions of the source/drain regions, i.e., on the HD regions, and on the upper surface of gate electrode 13. The selective formation of nickel layers 12 can be effected in any conventional manner. Advantageous results have been obtained by selectively depositing nickel layers 20 on the exposed portions of the HD regions 11B and on the upper surface of gate electrode 13 by electroless plating. Such selective electroless plating can be implemented by initially removing any oxide film from the main surface of the semiconductor substrate, i.e., the upper surfaces of the HD regions 11B, and from the upper surface of gate electrode 13, as with a buffered oxide etch (BOE) at room temperature for about 30 seconds. The surfaces of the source/drain regions and gate electrode are then activated employing a solution of palladium chloride, hydrochloric acid (HCl) and BOE, e.g., 0.1 g platinum chloride/liter, 10 milliliters HCl/liter and 25 milliliters of BOE/liter. The activated surface is then rinsed for about three minutes employing about 10 milliliters of HCl/liter and 25 milliliters of boric oxide/liter. Electroless deposition is then conducted employing a conventional nickel bath. It is believed that the activation of the cleaned silicon surface with palladium chloride forms palladium nucleation sites which ultimately remain in and improve the integrity of the metal silicide layer.

Another suitable catalytic activation solution comprises about 0.25 g of palladium chloride, about (10 ml of HCl/liter, about 25 ml of 10:1 BOE and about 50 mg/liter Rhodafac RE610, an anionic surfactant available from Rhone-Poulen, located in Cranberry, N.J. Another suitable rinse solution comprises about 10 ml, HCl/liter, about 25 ml of 10:1 BOE and about 50 mg/liter of Rhodafac RE610.

Figure 3:
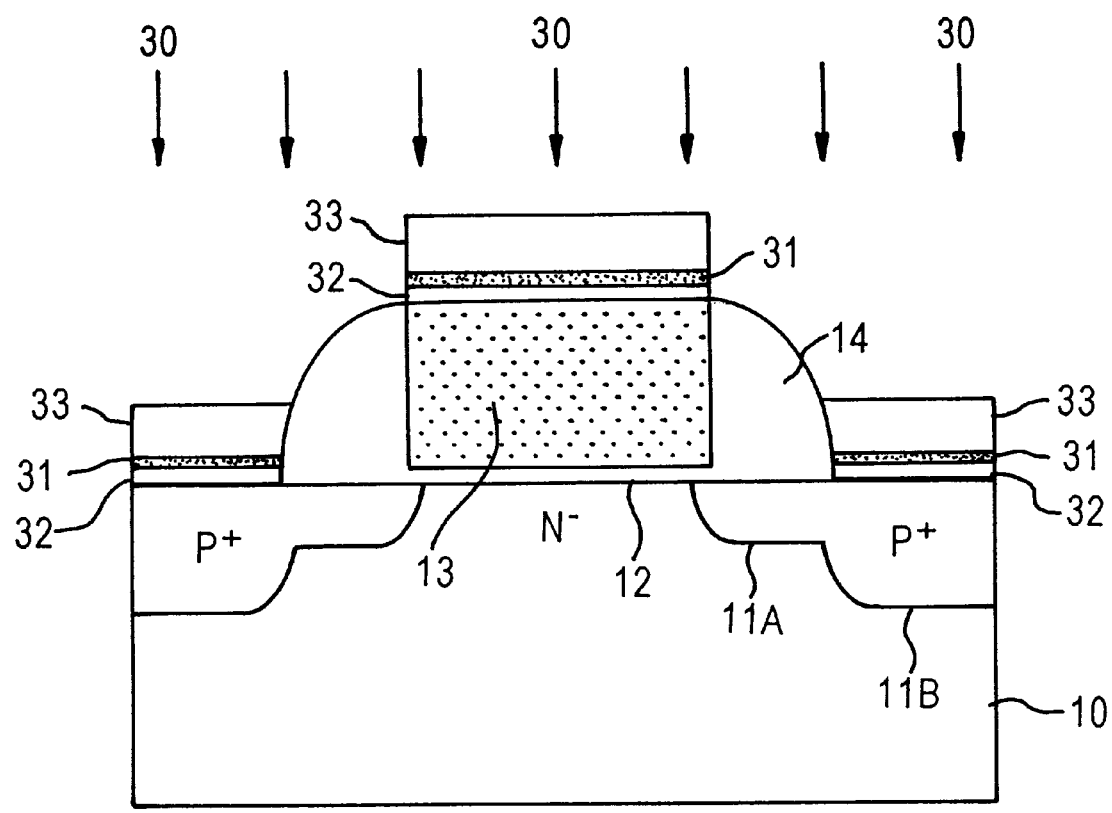
Figure 4:
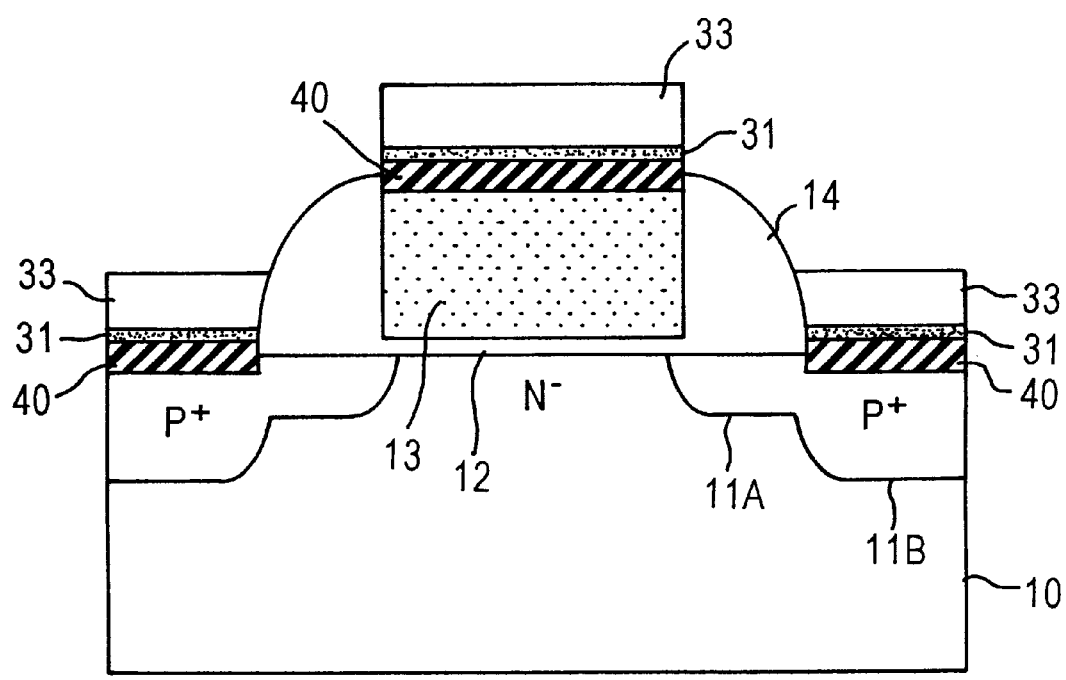

Adverting to FIG. 3, ion implantation is then conducted, e.g. nitrogen ion implantation to implant a layer of nitrogen atoms into each metal e.g. nickel layer (FIG. 2, 20) as indicated by Arrows 30. Upon annealing a barrier layer 31 is formed in each nickel layer dividing each nickel layer into a lower nickel portion 32 and an upper nickel portion 33 separated by barrier layer 31. Such annealing to complete formation of the barrier layer can be affected at a temperature of about 200° C. to about 700° C. Heating may be then conducted, as at a temperature of about 350° C. to about 750° C. to form nickel mono silicide (NiSi) by reaching the lower nickel portion 32 with silicon in the underlying substrate 10 and gate electrode 13 to form nickel silicide layers 40 as shown in FIG. 4. The presence of barrier layer 31 prevents silicidation of overlying metal layer 33, thereby minimizing silicon consumption in the substrate and gate electrode and, hence, improving integrity of shallow source/drain regions and gate electrode width.

Advantageously, the thickness of the lower metal layer (32, FIG. 3) can be tailored or optimized by controlling the implantation conditions to form a metal silicide layer (40, FIG. 4) having a low contact resistance for good ohmic contact with minimum silicon consumption. A particular advantage attendant upon selectively depositing nickel is that the nickel silicide silicidation temperature is low e.g. about 350° C. to about 750° C. Accordingly, the separate silicidation annealing can be omitted, thereby further simplifying the process, since typical backend thermal cycling will cause the silicidation reaction thereby forming the nickel silicide layer (40, FIG. 4). Thus, the nickel silicide improves ohmic contact rather than determining sheet resistance. Instead, sheet resistance is determined by the overlying nickel layer on the barrier layer. Subsequent processing is then conducted in a conventional manner.

The present invention can be readily integrated into current methodology with an attendant advantageous significant reduction in silicon consumption, thereby reducing the junction leakage current and improving the reliability of ultra-shallow source/drain regions. Another technological advantage of the present invention stemming from the significantly reduced silicon consumption is that relatively deep source/drain junctions are not necessary, thereby further simplifying process flow.

Advantageously, the present invention enables the formation of semiconductor devices having a design rule in the deep-submicron range employing elevated salicide technology to prevent an undesirable increase in parasitic series resistance while, at the same time, significantly minimizing junction leakage, even in semiconductor devices having an $X_j$ less than about 800 Å, even. 500 Å and below. Accordingly, the present invention achieves the technological advantage of enabling formation of reliable ultra-shallow source/drain junctions to meet the increasing demands for high density and miniaturization, as in manufacturing deep-submicron CMOS devices, such as sub 0.1 micron devices.

In the previous description, numerous specific details are set forth, such as specific materials, structures, chemicals, processes, etc., in order to provide a better understanding of the present invention. However, the present invention can be practiced without resorting to the details specifically set forth. In other instances, well-known processing structures have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, the method comprising sequentially:
   forming a structure comprising:
      a silicon-containing substrate;
      source/drain regions in the substrate with a channel region therebetween;
      a gate dielectric layer on the substrate over the channel region; a silicon-containing gate electrode, having an upper surface and side surfaces, on the gate dielectric layer; and
      a dielectric sidewall spacer formed directly on each side surface of the silicon-containing gate electrode, leaving a portion of each source/drain region exposed;
   selectively depositing a metal layer on the exposed portions of the source/drain regions and directly on the upper surface of the silicon-containing gate electrode with substantially no metal depositing on the dielectric sidewall spacers;
   forming a barrier layer within and dividing the metal layer into a lower metal portion below and an upper metal portion above the barrier layer; and
   heating to react the lower metal portion of each metal layer to form a metal silicide layer on the exposed portions of the source/drain regions and on the upper surface of the gate electrode.

2. The method according to claim 1, wherein the barrier layer prevents reaction of the upper metal portion with underlying silicon during heating.

3. The method according to claim 1, comprising ion implanting and annealing to form the barrier layer.

4. The method according to claim 3, comprising selectively depositing a metal layer comprising nickel, wherein the metal silicide layer comprises nickel silicide.

5. The method according to claim 4, comprising ion implanting nitrogen to form a barrier layer comprising nickel nitride, ion implanting boron to form a barrier layer comprising nickel boride or ion implanting carbon to form a barrier layer comprising nickel carbide.

6. The method according to claim 5, comprising ion implanting nitrogen to form a barrier layer comprising nickel nitride.

7. The method according to claim 6, comprising ion implanting nitrogen at an implantation dosage of about $1\times10^{15}$ atoms cm$^{-2}$ to about $1\times10^{17}$ atoms cm$^{-2}$ and at an implantation energy of about 10 KeV to about 100 KeV.

8. The method according to claim 7, comprising annealing at a temperature of about 200° C. to about 700° C. to form the nickel nitride barrier layer.

9. The method according to claim 6, comprising heating at a temperature of about 350° C. to about 750° C. to form the nickel silicide layer.

10. The method according to claim 1, wherein;
    the lower metal portion has a thickness of about 5 Å to about 100 Å;
    the barrier metal layer has a thickness of about 20 Å to about 300 Å; and
    the upper metal portion has a thickness of about 500 Å to about 1500 Å.

11. The method according to claim 3, comprising simultaneously annealing to form the barrier layer and heating to form the metal silicide layer.

12. The method according to claim 5, comprising ion implanting boron to form a barrier layer comprising nickel boride or ion implanting carbon to form a barrier layer comprising nickel carbide.

* * * * *